United States Patent [19]
Murakami

[11] Patent Number: 5,153,809
[45] Date of Patent: Oct. 6, 1992

[54] SELF DIAGNOSING CIRCUIT FOR A LOAD CONTROL CIRCUIT

[75] Inventor: Takashi Murakami, Furukawa, Japan

[73] Assignee: Alps Electric Co., Ltd., Tokyo, Japan

[21] Appl. No.: 576,746

[22] Filed: Sep. 4, 1990

[30] Foreign Application Priority Data
Nov. 10, 1989 [JP] Japan .................................. 1-130575

[51] Int. Cl.⁵ .............................................. H02H 3/08
[52] U.S. Cl. ........................................ 361/93; 361/86; 361/42; 361/18
[58] Field of Search ....................... 361/42, 18, 78, 86, 361/88, 93; 340/650, 652; 323/276

[56] References Cited
U.S. PATENT DOCUMENTS
4,441,136  4/1984  Hampshire ...................... 361/88

Primary Examiner—A. D. Pellinen
Assistant Examiner—C. Schultz
Attorney, Agent, or Firm—Guy W. Shoup; B. Noel Kivlin

[57] ABSTRACT

A self diagnosing circuit for a load control circuit is disclosed, which detects the state of a driving line connected with a load and protects a load driving circuit by turning off transistors in the load driving circuit, when a grounding accident occurs, in which, in the case where an error is produced so that the load doesn't work normally, responding to a control signal, a process is executed, corresponding to the content of that error and the content of that error is stored or made known to the exterior through display means.

3 Claims, 3 Drawing Sheets

| SORT OF ERRORS | CONTROL SIGNAL Sc | SELF DIAGNOSING SIGNAL SD |
|---|---|---|
| GND SHORT | H | 1.0 V UNDER |
| +12V SHORT | L | 2.0V OVER 3.0V UNDER |
| OPEN CONTACT | L | 0.5V OVER 1.5V UNDER |

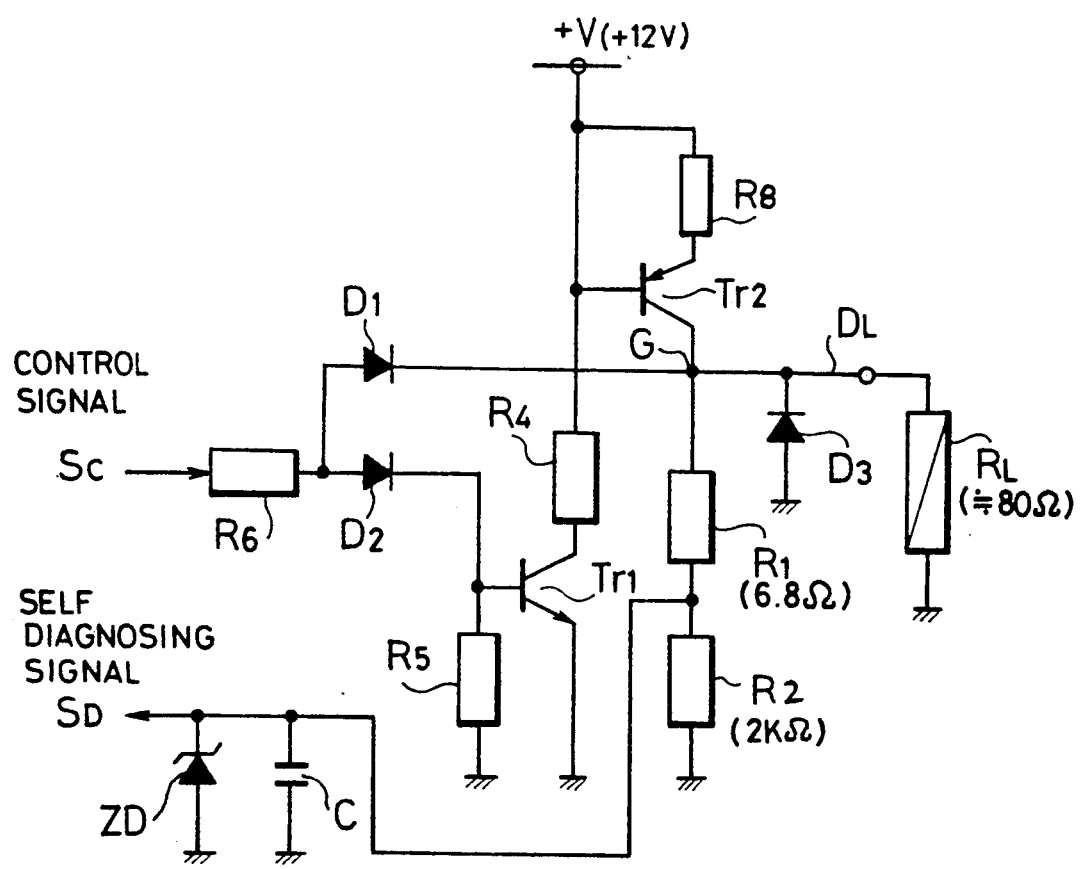

SELF DIAGNOSING CIRCUIT FOR A LOAD CONTROL CIRCUIT

FIELD OF THE INVENTION

The present invention relates to a self diagnosing circuit for a load control circuit, which detects the state of a driving line connected with a load and protects a load driving circuit by turning off transistors in the load driving circuit, when a grounding accident occurs, in which, in the case where an error is produced so that the load doesn't work normally, responding to a control signal, a process is executed, corresponding to the content of that error and the content of that error is stored or made known to the exterior through display means.

BACKGROUND OF THE INVENTION

For a load control circuit controlling the operation of a load by turning on/off a driving signal therefore, it is necessary to take measures so that it is prevented that the load control circuit is damaged and that a load connected therewith effects no erroneous operation, which can give rise to a dangerous state, when an error is produced in a circuit connecting the load with the load control circuit.

For example, in a load driving control circuit for driving and controlling auxiliary apparatuses such as an air conditioner mounted in a vehicle, etc., when an error is produced in the load driving control circuit itself, a load (a relay, etc.) connected therewith effects an erroneous operation and as the result not only a desired operation is not achieved, but also destruction of elements constituting the control circuit and damage of the battery can be caused by an excessive current.

FIG. 4 is a circuit diagram illustrating an example of this kind of prior art load control circuits, in which Trl is a control transistor; Tr2 is a drive transistor; R1, R2, R4, R5, R6 and R7 are resistors; C is a capacitor; D1 to D3 are diodes; ZD is a Zener diode; RL is a load; DL is an output line; SC is a control signal; SD is a self diagnosing signal; and V1 is a power supply (+12V).

In the figure, when no control signal SC is inputted in the state where the power supply voltage +V is applied (low level: off state), the control transistor Trl is turned-off. Consequently the drive transistor Tr2 is in the off state and no driving current is supplied to the load RL. When the control signal SC is inputted (high level: on state), the control transistor Trl is turned-on and thus the drive transistor Tr2 is also turned on. By the fact that the drive transistor Tr2 is turned on, driving current is supplied from the power supply +V to the load RL through the output line DL. At this time, the self diagnosing signal SD is obtained by driving the potential +V by resistors, i.e. the resistors R2, R1, R8 and the load RL.

In this case, when the control signal SC is at the lower level (non-driven state) and the load RL is connected normally, the potential at the point G is pulled down by the resultant resistance of the resistors R1, R2 and the resistance of the load RL. Therefore it is approximately at 0 V and the self diagnosing signal at the output terminal for the self diagnosing signal is also approximately 0 V. Further, also in the open contact state, where the load RL is disconnected from the output line DL, since the potential at the point G is pulled down by the resistors R1 and R2, it is approximately 0 V and the self diagnosing signal SD is also approximately 0 V.

On the other hand, when the control signal SC is applied thereto (high level: driven state) in the GND short state, where the potential of the drive line DL is dropped to that of the ground line (GND), the base potential of the transistor Trl is at the GND level and the transistor is turned off. Consequently the drive transistor Tr2 is turned off so that the destruction of this transistor is avoided. At this time, since the point G is at the GND potential, the self diagnosing signal is also 0 V.

In this way, it is possible to distinguish the GND short error, where the potential of the drive line for the load RL is dropped to that of the GND line, the open contact error, where the drive line is opened, and the normal state by monitoring the level of the control signal, high or low, and the potential of the self diagnosing signal SD.

By the prior art technique, it is not possible to distinguish the GND short error of the drive line DL in the non-driven state (SC is at the low level), where no control signal is applied thereto and the open contact error of the drive line stated above from each other and when the control signal is applied thereto in that state, the drive control circuit including the drive transistor is damaged at the GND short error. Further, it is necessary to detect a +V power supply short error, where the drive line DL is short-circuited with the +V power supply. In particular, this +V short error causes the damage of the driving control circuit and at the same time it gives rise to an extremely dangerous situation, where the load is driven when the control signal is at the low level.

OBJECT OF THE INVENTION

The object of the present invention is to provide a self diagnosing circuit for a load control circuit capable of solving the problems of the prior art techniques described above, which detects the state of the line (drive line) connecting the load with the load control circuit to protect the load driving control circuit when errors are produced and at the same time to store the kind of the produced errors or to inform the exterior thereof through display means.

SUMMARY OF THE INVENTION

The above object can be achieved by a self diagnosing circuit detecting the state of the drive line connecting the load with the load control circuit, in which there are disposed a constant voltage supplying circuit (constant voltage power supply) serving as a power supply regulated at a constant voltage, which controls turning on/off of the load control signal on the basis of a diagnosing output signal of the self diagnosing circuit described above, and a memory section storing results obtained by diagnosing the state of the load or a display section informing the exterior of the state of the load.

The state of the drive line connected with the load is judged by using the voltages from the driving control circuit including the self diagnosing circuit, the power supply driving the load, and the constant voltage supplying circuit disposed in this self diagnosing circuit as well as the high/low level of the control signal and on the basis of this judgment result, at needs, the output of the control signal is controlled and further the state of errors is stored/displayed on the basis of the result of the judgment.

BRIEF DESCRIPTION OF THE DRAWINGS

FIG. 4 is a circuit diagram showing an example of this kind of prior art load control circuits.

DETAILED DESCRIPTION

Figures 1, 3:
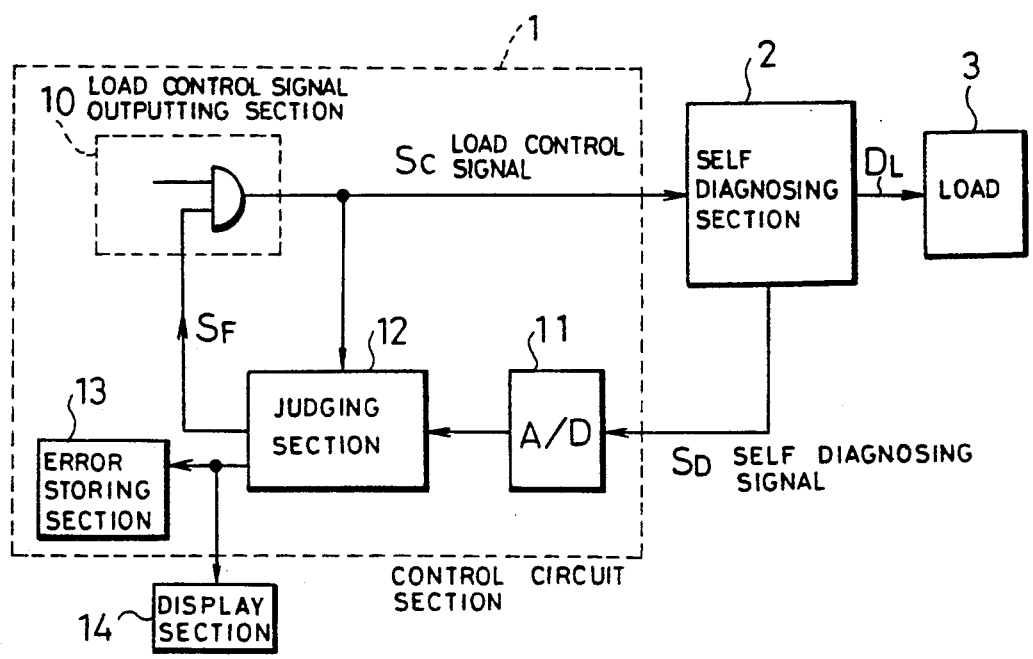
FIG. 1 is a block diagram for explaining an embodiment of the present invention.
FIG. 3 is a scheme showing the judgment criterion of the judging section on the basis of the self diagnosing signal output and the state of the control signal.

Hereinbelow FIG. 1 is a block diagram for explaining an embodiment of the present invention, in which reference numeral 1 is a control circuit section; 2 is a self diagnosing section consisting of a load driving control circuit and a self diagnosing circuit; 3 is a load; 10 is a load control signal outputting section; 11 is an analogue/digital converting section (A/D); 12 is a judging section; 13 is an error storing section; and 14 is a display section.

In the figure, the load 3 is e.g. a relay for controlling auxiliary materials such as an air conditioner mounted on a vehicle and other controlled elements, which are driven by the load control signal SC generated by the load control signal outputting section 10 in the control circuit section 1. The self diagnosing section 2 outputs a potential signal corresponding to the state of the load (state of the drive line DL) to the A/D 11. The A/D 11 converts the inputted analogue potential signal into a digital signal, which is given to the judging section 12.

The judging section 12 forms a judgment output on the basis of the load control signal SC and the output signal from the self diagnosing section 2. When the judging section 12 judges an error, this judgment result is stored in the memory circuit in the error storing section 13 and at the same time the error state is displayed in the display section 14 in order to inform the user thereof. In the case where this error state is a damage of the self diagnosing section or the load, or one, in which the load is driven undesirably, an inhibiting output SF inhibiting the load control signal SC is given to the load control signal outputting section 10 so as to interrupt the output of the load control signal (high level = driving signal).

Although there are disposed both the memory section and the display section, it is possible also to dispose either one of them. The fact of the error production stored in the storing section can be utilized for stopping the drive of the load by reading out the memory content at the succeeding switch-on of the power supply or as a record of the error history for maintenance. On the other hand, the display section is useful for the user to take suitable measures at the time of the error production.

Figure 2:
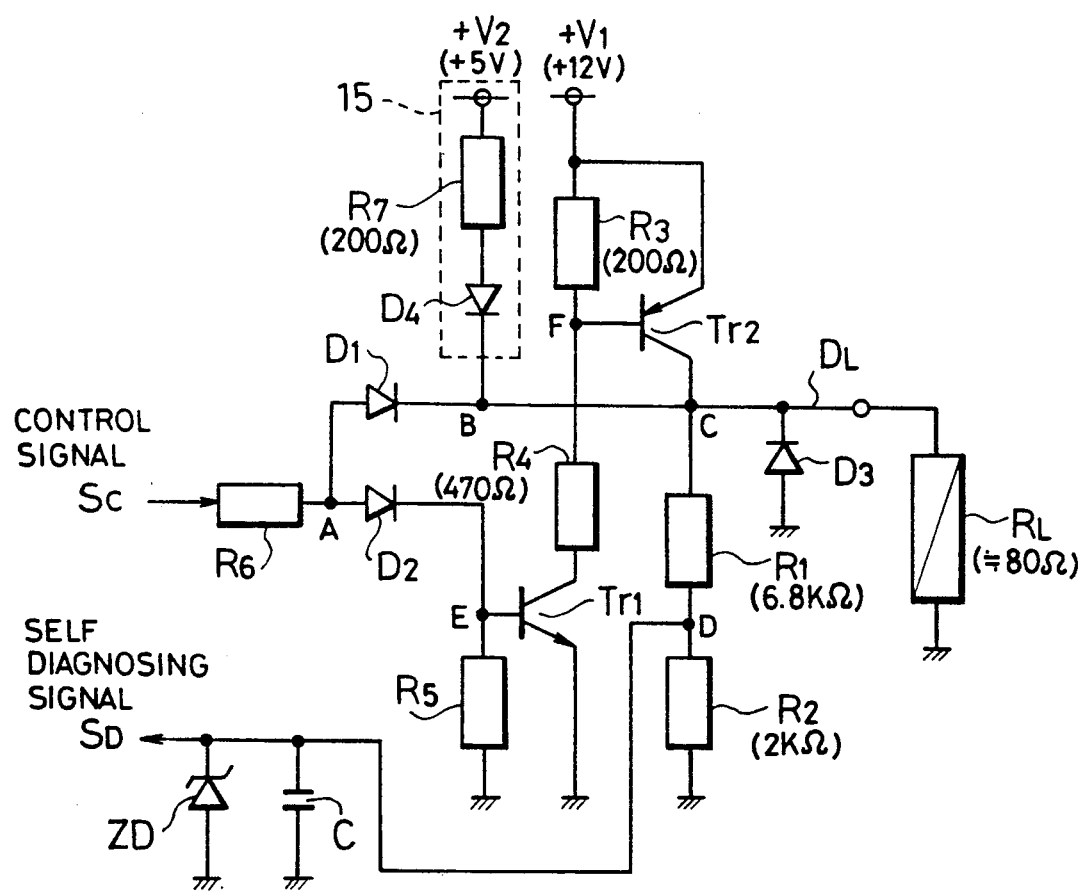
FIG. 2 is a circuit diagram for explaining a concrete example of the self diagnosing section in FIG. 1.

FIG. 2 is circuit diagram for explaining a concrete example of the self diagnosing section in FIG. 1, in which 15 represents a constant voltage supplying circuit consisting of a power supply regulated so that the output thereof is at a constant voltage (+V2), a resistor R7 and a diode D4 and the parts identical to those indicated in FIG. 4 described previously are denoted by the same reference numerals.

In the figure, when the control transistor Tr1 and the drive transistor Tr2 are turned on by the input of the load drive signal (high level signal) of the control signal SC, electric power from the driving power supply +V1 (+12 V) flows to the load RL through the drive line DL. Since the operation of driving the load RL is identical to that explained, referring to FIG. 4, explanation thereof will be omitted.

In the present embodiment, apart from the driving power supply +V1, there is disposed the power supply (constant voltage power supply V2) 15 regulated so that the output thereof is at a constant voltage, which is e.g. +5 V. By connecting this power supply V2 with the output terminal line of the drive line DL through a series circuit consisting of the resistor R7 and the diode D4, in addition to the judgment of the open (open contact) and the GND short of the drive line DL, the error production state of a short circuit with the +V1 power supply line (+12 V in the embodiment) (+V1 short, hereinbelow called simply +12 V short) is judged, which can be stored/made known).

Now the output signal of the self diagnosing circuit corresponding to various error and the circuit operation using the output signal will be explained, referring to FIG. 2.

(1) At first, in the case where the drive line DL supplying the driving signal to the load RL regardless of the presence or the absence of the control signal SC is short-circuited with the ground line (GND = low level: L level) by some reason (GND short error), there is a risk that a high intensity current flows through the driving transistor Tr2, which causes the destruction thereof. In order to prevent it, the present embodiment acts as follows by the circuit construction indicated in the figure. Hereinbelow this is called protection mode.

When the potential of the drive line DL is dropped to the GND (L level), the level at the point A in FIG. 2 is at the GND. Therefore the A point is also at the L level and the control transistor Tr1 is turned off. In this way, the F point is at the high level (H level) and the driving transistor Tr2 is turned off. Consequently the destruction of the driving transistor Tr2 is prevented. That is, the short protection is achieved.

(2) Next the detection of errors in the load driving control circuit and the processing operation thereof for the state of the high/low level of the control signal SC will be explained. Hereinbelow this is called error mode in order to distinguish it in the explanation from the protection mode in 1 explained previously.

In the error mode there are three different modes, i.e. 1 GND short mode, 2 +12 V short mode and 3 open contact mode.

At first the GND short mode indicated in 1 is one detected, when the control signal SC is at the high level (state where the load RL is driven). When the drive line DL is in the on-state (a drive output is present) and a short-circuit with the GND takes place, the point C in the circuit indicated in FIG. 2 is at the low level. Consequently the point D is at the low level and the self diagnosing signal SD is at the low level, which is about 0V in this case.

The +12 V short mode indicated in 2 is one detected, when the control signal SC is at the low level (state where the load RL is not driven). When the drive line DL is short-circuited with +12 V, the level at the point C in FIG. 2 is at +12 V. Supposing that the resistors R1 = 6.8 kΩ and R2 = 2kΩ, the level VD at the point D is:

$$VD = \frac{R2}{R1 + R2} \times 12 = 2.7 \text{ V}$$

and this potential is outputted as the self diagnosing signal SD for this error.

The open control mode indicated in 3 is one detected, when the control signal SC is at the low level (state where the load RL is not driven) and in the case where the drive line DL is in the open state. At this time, supposing that the forward voltage drop of the diode D4 is VRF=1.0 V, the potential level VB(C) at the point B(C) in FIG. 2 is:

$$VB(C) = 5 - VRF \approx 4.0 V$$

and the potential level VD at the point D is $$VD = \frac{R2}{R1 + R2} \times VB(C) \approx 0.9 \text{ V}$$

This potential is outputted as the self diagnosing signal SD at this time.

Normally it is approximately 0.2 V.

FIG. 3 is a scheme for explaining the criterion, when the judging section 12 in FIG. 1 judges errors on the basis of the self diagnosing signal output and the state of the control signal SC (driven/not driven : high/low level). It is judged that when the control signal SC is at the high level and the self diagnosing signal SD is below 1.0 V, it indicates a GND short error; when the control signal SC is at the low level and the self diagnosing signal SD is above 2.0 V and below 3.0 V, it indicates a +12 V short error; and when the control signal SC is at the low level and the self diagnosing signal SD is above 0.5 V and below 1.5 V, it is an open contact error. The kind of the respective errors is stored in the error storing section 13 or displayed in the display section 14. It may be stored in the storing section 13 and at the same time displayed in the display section 14.

As explained above, according to the present invention, it is possible to provide a self diagnosing circuit for a load control circuit, which can diagnose that the drive line is short-circuited with the driving power supply in addition to the diagnosis of the open circuit and the GND short of the drive line connected with the load to protect the load driving control circuit when errors are produced and at the same time to store the kind of the produced errors or to inform the exterior thereof through display means.

What is claimed is:

1. A self diagnosing circuit for a load control circuit characterized in that it comprises a control circuit section having at least a load control signal outputting section and an error judging section, and a self diagnosing section provided with a self diagnosing circuit outputting a self diagnosing signal indicating the state of the drive line, which supplies a driving signal to a load and at the same time connects the load on the basis of a load control signal outputted by the said load control signal outputting section, wherein a constant voltage power supply, which supplies a potential regulated at a constant voltage, is disposed in said self diagnosing circuit apart from a driving power supply for the load, and said judging section judges a short error of said drive line with the line of said driving power supply by using said constant voltage power supply and the potential level of said driving line at the driven level of said load control signal.

2. A self diagnosing circuit for a load control circuit according to claim 1, characterized in that said load could signal outputting section comprises a sensing circuit consisting of at least two resistors connected in series.

3. A self diagnosing circuit for a load control circuit characterized in that it comprises a control circuit section having at least a load control signal outputting section and an error judging section and a self diagnosing section provided with a self diagnosing circuit outputting a self diagnosing signal indicating the state of the drive line, which supplies a driving signal to a load and at the same time connects the load on the basis of a load control signal outputted by the said load control signal outputting section, wherein a constant voltage power supply, which supplies a potential regulated at a constant voltage, is disposed in said self diagnosing circuit apart from a driving power supply for the load, said judging section judges a short error of said drive line with the line of said driving power supply by using constant voltage power supply and the potential level of said driving line at the driven level of said load control signal, and said judging section judges a short error and an open contact error of said drive line with the ground line at the non-driven level of said load control signal.

* * * * *

UNITED STATES PATENT AND TRADEMARK OFFICE
CERTIFICATE OF CORRECTION

PATENT NO.   :   5,153,809
DATED        :   October 6, 1992
INVENTOR(S)  :   Murakami It is certified that error appears in the above-identified patent and that said Letters Patent is hereby corrected as shown below:

Col. 6 line 24:

Delete "could" and insert --control-- .

Signed and Sealed this

Nineteenth Day of October, 1993

Attest:

BRUCE LEHMAN

Attesting Officer    Commissioner of Patents and Trademarks